United States Patent
Okumura

(10) Patent No.: US 6,815,269 B2
(45) Date of Patent: Nov. 9, 2004

(54) THIN-FILM TRANSISTOR AND METHOD FOR MANUFACTURING THE SAME

(75) Inventor: Hiroshi Okumura, Kanagawa (JP)

(73) Assignee: NEC LCD Technologies, Ltd. (JP)

( * ) Notice: Subject to any disclaimer, the term of this patent is extended or adjusted under 35 U.S.C. 154(b) by 0 days.

(21) Appl. No.: 10/430,540

(22) Filed: May 6, 2003

(65) Prior Publication Data

US 2003/0211666 A1 Nov. 13, 2003

(30) Foreign Application Priority Data

May 8, 2002 (JP) ........................................ 2002-132310

(51) Int. Cl.[7] .......................... H01L 21/00; H01L 21/84
(52) U.S. Cl. .......................... 438/149; 438/96; 438/97; 438/166; 438/308; 438/365; 438/482; 438/535; 257/63; 257/64; 257/74; 257/75; 257/49; 257/50; 257/52
(58) Field of Search ................................ 438/149, 166, 438/96–97, 308, 365, 535, 795, 482; 257/63–66, 74–75, 49–57, 755

(56) References Cited

U.S. PATENT DOCUMENTS

| | | | | |
|---|---|---|---|---|
| 5,352,291 A | * | 10/1994 | Zhang et al. ................... | 117/8 |
| 5,943,593 A | * | 8/1999 | Noguchi et al. ............. | 438/487 |
| 6,020,224 A | * | 2/2000 | Shimogaichi et al. ....... | 438/158 |
| 6,072,194 A | * | 6/2000 | Wakita et al. ................ | 257/66 |
| 6,396,104 B2 | * | 5/2002 | Maekawa et al. ........... | 257/347 |
| 6,492,659 B1 | * | 12/2002 | Yamazaki et al. ............ | 257/59 |
| 6,566,754 B2 | * | 5/2003 | Hara et al. ................... | 257/755 |
| 6,599,788 B1 | * | 7/2003 | Kawasaki et al. ........... | 438/158 |
| 6,608,326 B1 | * | 8/2003 | Shinagawa et al. ........... | 257/64 |
| 6,680,487 B1 | * | 1/2004 | Kokubo et al. ............... | 257/66 |
| 2001/0012702 A1 | * | 8/2001 | Kim ............................ | 438/795 |
| 2002/0093061 A1 | * | 7/2002 | Yamazaki et al. .......... | 257/380 |
| 2002/0121665 A1 | * | 9/2002 | Kawasaki et al. .......... | 257/347 |

FOREIGN PATENT DOCUMENTS

| | | | | |
|---|---|---|---|---|
| JP | 63200572 A | 8/1988 | ............ | J01L/29/78 |
| JP | 02-283073 | * 11/1990 | ......... | H01L/29/784 |
| JP | 06140324 | 5/1994 | ........... | H01L/21/20 |
| JP | 09092839 A | 4/1997 | ......... | H01L/29/786 |
| JP | 2689596 | 8/1997 | ......... | H01L/29/786 |
| JP | 11-274095 | 10/1999 | ......... | H01L/21/268 |

OTHER PUBLICATIONS

Pangal et al. "Thin–film transistors in polycrystallin silicon by blanket and local source/drain hydrogen plasma seeded cystallization" IEEE trans. of electron devices vol. 47 No. 8 Aug. 2000, p. 1599–1607.*

Im et al., "Crystalline Si Films for Integrated Active–Matrix Liquid–Crystal Displays" MRS Bulletin, Mar. 1996, vol. 2, pp. 39–48.

Nakata et al., pre–conference publication on 5p–ZD–4 and 4p–ZD–5 for the 61st Society of Applied Physics Seminar (2000), No. 2, p. 759.

* cited by examiner

*Primary Examiner*—Matthew Smith
*Assistant Examiner*—Granvill D. Lee, Jr.
(74) *Attorney, Agent, or Firm*—Hayes Soloway P.C.

(57) ABSTRACT

A thin-film transistor is formed by a polycrystalline silicon film having a thin-film part and a thick-film part, the thin-film part minimally being used as a channel part. The polycrystalline silicon film is formed by laser annealing with an energy density that completely melts the thin-film part but does not completely melt the thick-film part. Because large coarse crystal grains growing from the boundary between the thin-film part and the thick-film part form the channel part, it is possible to use a conventional laser annealing apparatus to easily achieve high carrier mobility and low leakage current and the like.

23 Claims, 4 Drawing Sheets

THIN-FILM TRANSISTOR AND METHOD FOR MANUFACTURING THE SAME

BACKGROUND OF THE INVENTION

1. Field of the Invention

The present invention relates to a thin-film transistor (TFT) used in an active matrix type display or the like, and to a method for manufacturing a thin-film transistor.

2. Description of Related Arts

In recent years, polycrystalline silicon TFTs have been actively developed for use a thin-film device for forming integrated circuits on glass substrates. A general method for forming a polycrystalline silicon film is the excimer laser method of first forming an amorphous silicon film and then irradiating the amorphous silicon film with light from an excimer laser, so as to obtain a polycrystalline silicon film by melting and re-crystallizing the amorphous silicon film.

In a commercially available laser annealing apparatus for use in the excimer laser method, a laser light beam with an irradiation aperture being around 300 mm by 0.4 mm is scanned in the short-axis direction with a pitch of several tens of $\mu$m. Using this apparatus, because it is possible to form a polycrystalline silicon film in which sub-micron ordered crystal grains are randomly disposed, it is possible to mass produce thin-film transistors with a mobility of approximately 150 cm$^2$/Vs with a high yield. In order to achieve higher performance in future TFTs, it is necessary to both increase the size of the crystal grains and control the position of the crystal grains.

In Japanese Patent No. 2689596, for example, there is disclosed a technology for achieving a polycrystalline silicon film with large coarse crystal grains, by using a two-layer amorphous silicon film to increase the grain size in the thin film part.

In this disclosure, however, there is no language whatsoever teaching the melted condition of a film based on laser irradiation conditions or a film structure other than a thickness of the film.

Additionally, there is no language that teaches with regard to crystal grain position control.

On the other hand, a progress is being made in the development of pseudo-single-crystalline silicon, by improving excimer laser annealing method and by forming crystal grain sizes that are nearly the same length as a TFT channel, while controlling the positions at which they occur.

For example, as disclosed by Im et al on page 39 of the March 1996 edition of the MRS Bulletin No. 2, by irradiating an extremely narrow line beam having a width of 5 $\mu$m onto an island-shaped amorphous silicon thin-film with a pitch of 0.75 $\mu$m, it is possible to form a polycrystalline silicon thin film having unidirectional growth, in which the crystal grains are substantially linearly arranged in parallelism with each other.

Additionally, as disclosed by Nakata, et al in a pre-conference publication for the 61th Society of Applied Physics Seminar (2000), No. 2, page 759, on 5p-ZD-4 and 4p-ZD-5, by using a phase-shift mask to create a laser beam having an intensity period on an order of a micron, it is possible to form position-controlled silicon crystal grains with approximately 3 $\mu$m growth.

By using these methods, it will be possible to form with good control ability, a polycrystalline silicon thin film with crystal grains each having uniform large diameter at a TFT channel position.

In the case omelting these methods to control the intensity profile of a laser beam with an order of a micron, it is necessary to improve the resolution of the optics to a sub-micron order.

In doing this, however, there are the problems of an increase cost for the optics, a reduction in efficient of laser beam use, and a narrowing the depth of focus of the optics. If the depth of focus of the optics became narrower than an amount of warping or bending of the substrate, it becomes necessary to provide the substrate stage with a height-adjustment function.

It is also necessary to be able to control the movement of the substrate stage with a sub-micron order. Additionally, when using a phase-shift mask, because there is a need to have the mask be in substantially intimate contact with the amorphous silicon surface, silicon atoms that float away from the surface of the amorphous silicon film during laser annealing contaminate the mask, thereby requiring frequent replacement of a high-cost mask.

The resulting complexity of the annealing apparatus not only results in the apparatus being expensive, but also in a reduction of up-time.

Accordingly, it is an object of the present invention to provide a TFT and a method for manufacturing a TFT which simply achieves both high carrier mobility and low leakage current and the like.

SUMMARY OF THE INVENTION

In order to achieve the above-noted object, the present invention adopts the following basic technical constitution.

Specifically, a first aspect of the present invention relates to a thin-film transistor which comprising a polycrystalline silicon film layer formed on a substrate, a gate electrode formed on the polycrystalline silicon film layer via a gate insulation layer and source and drain electrodes both being arranged on both sides of the gate electrode and being connected to the polycrystalline silicon film layer, and wherein a part of the polycrystalline silicon film layer comprising a thin-film part and a thick-film part and at least a part of the thin film part being minimally used as a channel part of the transistor, and further wherein the thin-film part comprising large coarse crystal grains.

A second aspect of the present invention relates to a thin-film transistor which comprising a configuration as mentioned in the above-noted first aspect of the present invention and is further characterized in that the thick-film part comprising crystal grains a size of which is smaller than that of the large coarse crystal grains formed in the thin-film part.

A third aspect of the present invention relates to a thin-film transistor which comprising a polycrystalline silicon film layer formed on a substrate, a gate electrode formed on the polycrystalline silicon film layer via a gate insulation layer and source and drain electrodes both being arranged on both sides of the gate electrode and being connected to the polycrystalline silicon film layer, and wherein a part of the polycrystalline silicon film layer comprising a thin-film part and a thick-film part and at least a part of the thin film part being minimally used as a channel part of the transistor, and further wherein at least a portion of the thin-film part is in fully melted condition, while at least a portion of the thick-film part is in not fully melted condition.

A fourth aspect of the present invention relates to a thin-film transistor comprising:

a polycrystalline silicon film comprising a thin-film part and a thick-film part, the thin-film part being minimally used as a channel part, wherein the polycrystalline silicon film is formed by laser annealing with an energy density that completely melts the thin-film part but does not completely melt the thick-film part.

A fifth aspect of the present invention relates to a method for manufacturing a thin-film transistor which comprising a polycrystalline silicon film layer formed on a substrate, a gate electrode formed on the polycrystalline silicon film layer via a gate insulation layer and source and drain electrodes both being arranged on both sides of the gate electrode and being connected to the polycrystalline silicon film layer, the method comprising the steps of;

forming a thin-film part and a thick-film part of an amorphous silicon film on a substrate;

polycrystallizing the thin-film part and the thick-film part by laser annealing the amorphous silicon film using an energy density completely melting the thin-film part and not completely melting the thick-film part; and forming a thin-film transistor with the thin-film part as at least a channel part.

DESCRIPTION OF THE PREFERRED EMBODIMENTS

Embodiments of the present invention are described below in detail, with references made to relevant accompanying drawings.

Figure 2A:
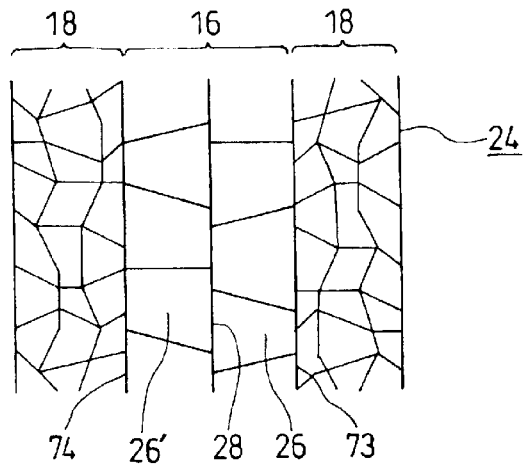
FIG. 2A is a plan view corresponding to FIG. 1D.
Figure 2B:
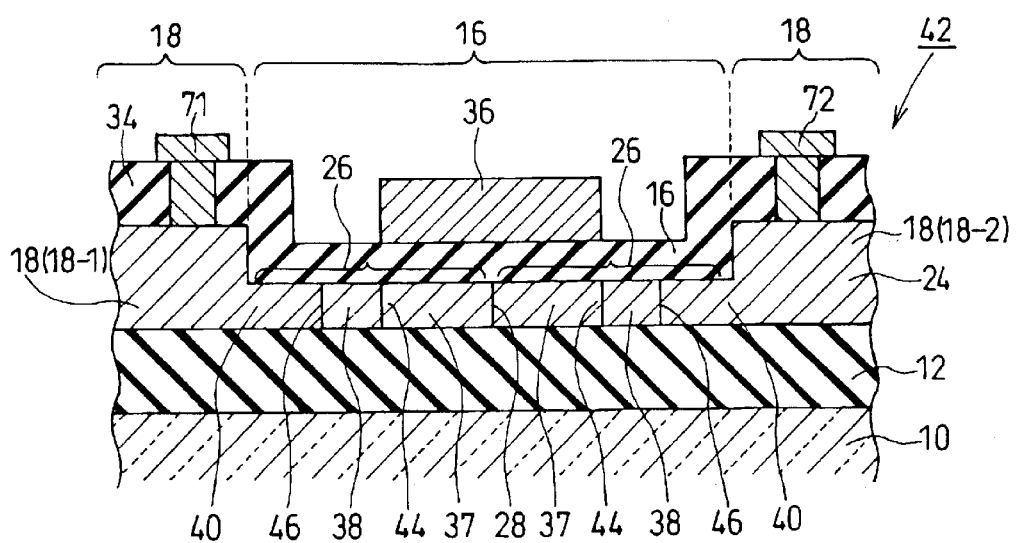
FIG. 2B is a cross-sectional view showing the next manufacturing process.

First, one specific embodiment of a TFT of the present invention is shown in FIG. 2(B).

Note that, in FIG. 2(B), it is shown that a thin-film transistor 42 which comprising a polycrystalline silicon film layer 24 formed on a substrate 10 via an insulation film 21, a gate electrode 36 formed on the polycrystalline silicon film layer 24 via a gate insulation layer 34 and source and drain electrodes 71,72 both being arranged on both sides of the gate electrode 36 and being connected to the polycrystalline silicon film layer 24, and wherein a part of the polycrystalline silicon film layer 24 comprising a thin-film part 16 and a thick-film part 18 and at least a part of the thin film part 16 being minimally used as a channel part 37 of the transistor 42, and further wherein the thin-film part 16 comprising large coarse crystal grains 26 as shown in FIG. 2(A).

And FIG. 2(B) further shows that the thick-film part 18 of the TFT 42 of the present invention comprises crystal grains 27 a size of which is smaller than that of the large coarse crystal grains 26 formed in the thin-film part 16.

In the TFT of the present invention, it is also understood that at least a portion of the thin-film part 16 is in fully melted condition, while at least a portion of the thick-film part 18 is in not fully melted condition.

In order to achieve this specific configuration of the TFT of the present invention, the polycrystalline silicon film 24 is first formed to have the thin-film part 16 and a thick-film part 18, and further the polycrystalline silicon film 24 is treated by laser annealing with an energy density that completely melts the thin-film part 16 but does not completely melt the thick-film part 18.

In the present invention, it is preferable that the energy density completely melting the thin-film part is an energy density at least as great as a micro-crystallization threshold value of the thin-film part 16, and while the energy density not completely melting the thick-film part 18 is an energy density less than a micro-crystallization threshold value of the thick-film part 18.

The above-noted phrase "energy density that completes melts" used herein means an energy density that is at least as great as the micro-crystallization threshold value. The crystal grain diameter in the polycrystalline silicon film formed by laser annealing of the amorphous silicon film is dependent upon the laser energy.

As the laser energy density increases, there is an increase in the crystal grain diameter. However, it is known that after exceeding a specific energy density, the diameter thereof becomes a very small value of 20 nm or smaller (with the exception that for some film thicknesses, rather than crystallizing after melting with irradiating laser light, become amorphous). The energy density at this point is known as the micro-crystallization threshold value.

It is understandable that micro-crystallization will occur when the melting condition of an amorphous silicon film changes from incomplete melt to complete melt, and thereby the nucleation mechanism at the time of re-crystallization would change from heterogeneous nucleation with using a boundary surface formed between the substrate and the amorphous silicon film as a nucleation site, to homogeneous nucleation not having special nucleation sites.

This change in the nucleation mechanism shows dependence on the temperature reached at the boundary between the substrate and the amorphous silicon film, the temperature distribution in the film thickness direction, and the film cooling rate and the like.

The micro-crystallization threshold value, therefore, changes and is dependent upon such parameters as the film thickness of the amorphous silicon film, the structure of the amorphous silicon film, the optical constants of the amorphous silicon film, and the pulse laser light wavelength and pulse width. For example, the micro-crystallization threshold value of a polycrystalline silicon film that has once been laser-annealed is approximately 14% greater than that of the amorphous silicon film before laser annealing. When the energy density is further increased, film peeling occurs because of abrasion.

In laser annealing using an energy density that causes complete melt of the thin-film part 16 but does not cause complete melt of the thick-film part 18, the temperature in the thick-film part 18 is below the temperature of the micro-crystallization threshold value.

For this reason, in the thick-film part 18 the boundary between the substrate and the amorphous silicon film is the major location of the nucleation sites, and there is crystal growth from the boundary between the substrate and the amorphous silicon film progressing toward the amorphous silicon film surface.

In the thin-film part 16 complete melt occurs, and because there is suppression of nucleation at the boundary between the substrate and the amorphous silicon film, crystal grains formed in the thick-film part 18 are used as seed crystals, and large coarse crystal grains 26 growing in the lateral direction (film surface direction) are obtained. These large coarse crystal grains, therefore, can be said to be position controlled in one dimension.

Therefore, the thin-film transistor (TFT) of the present invention is further characterized in that the large coarse crystal grains 26 formed in the thin-film part 16 are grown along a direction parallel to a surface of the channel part 37 thereof, while the crystal grains 27 formed in the thick-film part 18 are grown along a direction from a surface of the substrate 10 to a surface of the polycrystalline silicon film layer 24.

If the energy density is excessively high, so that not only the thin-film part but also the thick-film part is completely melted, the micro-crystallized construction is formed in both the thin-film part and the thick-film part.

On the other hand, if the energy density is excessively small, so that the melt of the thick-film part is insufficient, there is residual amorphous silicon film in the region near the boundary between the substrate (or substrate with an insulation film 12, such as $SiO_2$) and the amorphous silicon film.

When this occurs, because the seeds crystals are formed more on the thin-film part side than at the boundary between the thin-film part and the thick-film part, the grain diameters of the large coarse crystal grains are reduced.

Additionally, in the case in which the energy density is excessively low and does not completely melt the thin-film part, because nucleation occurs at the boundary between the substrate (or substrate with an insulation film 12, such as $SiO_2$) and the amorphous silicon film, non-uniform crystal grains smaller than 1 $\mu$m are formed randomly both in the thin-film part 16 and the in the thick-film part 18.

Given the above, the irradiation energy density is set so that it is at least the micro-crystallization threshold value of the thin-film part 16 and also does not reach the abrasion threshold value thereof, and further so that it is at least a value at which the entire amorphous silicon film in the thick-film part 18 is made polycrystalline in the film thickness direction but does not reach the micro-crystallization threshold value thereof.

Accordingly, in the TFT according to the present invention, the energy density at which there is complete melt of the thin-film part 16 is an energy density at least as great as the micro-crystallization threshold value of the thin-film part 16, and the energy density at which there is not complete melt of the thick-film part 18 is an energy density that is less than the micro-crystallization threshold value of the thick-film part.

And further, in the TFT according to the present invention, a TFT according to a third aspect of the present invention, the energy density at which the thin-film part 16 is completely melted is an energy density at least as great as the thin-film part micro-crystallization threshold value but less than the abrasion threshold value thereof, and the energy density at which there is not complete melt of the thick-film part 18 is an energy density that is at least as great as the poly-crystallization threshold value of the thick-film part and not as great as the micro-crystallization threshold value thereof.

As mentioned above, in the TFT according the present invention, it is also preferable the source electrode 71 is formed on one of the thick-film parts 18-1, while the drain electrode 72 being formed on another thick-film part 18-2.

And further, in the present invention, it is also preferable that in addition to the channel part 37, an LDD region 38 and a part of a source-drain region 40 are formed in a part of the channel part 37 of the thin-film part 16.

Note that in the above-mentioned TFT, in addition to a channel part 37, a lightly doped drain (LDD) region 38 and part of a source-drain region 40 are formed in the thin-film part 16.

Because the LDD region 38 and part of the source-drain region 39 are also formed in a thin-film part having large coarse crystal grains, it is possible to achieve low leakage current in the LDD region 38 and low resistance in the source-drain region 40.

On the other hand, in the present invention, at least two rows 26, 26' of the crystal grains can be formed in the channel length direction of the thin-film part 16, as shown in FIG. 2(A).

More over, in the present invention, the two rows 26, 26' of crystal grains are formed in a channel length direction and in the thin-film part 42. In this case in which there is a boundary 73 or 74 formed between the thin-film part 16 and the thick-film part 18, in the source-drain region 40, because crystal grains start to be grown from both of these boundaries 73 and 74, two rows 26 and 26' of crystal grains grow in the channel width direction in the thin-film part 16.

That is, in the thin-film part 16, because crystal grain boundary intersecting with the channel length direction, is substantially a plane, there is an improvement in carrier mobility.

Further more, in the present invention, a channel part 16 of the TFT may be formed in only one row 26' selected from the two rows 26 and 26' of crystal grains.

In this embodiment of the present invention, because there is substantially no crystal grain boundary 28 intersecting with the channel length direction, there is a further improvement in the carrier mobility.

In the present invention, a length of the channel length direction of the thin-film part can be set at around 8 $\mu$m or less, in which case it is relatively easy to form large coarse crystal grains with a diameter up to 4 $\mu$m. If a length of the thin-film part in a channel length direction is made 8 $\mu$m or smaller, it is easy to form two rows of crystal grains in the channel width direction of the thin-film part as shown in FIG. 2(A) and FIG. 2(B).

Figure 3A:
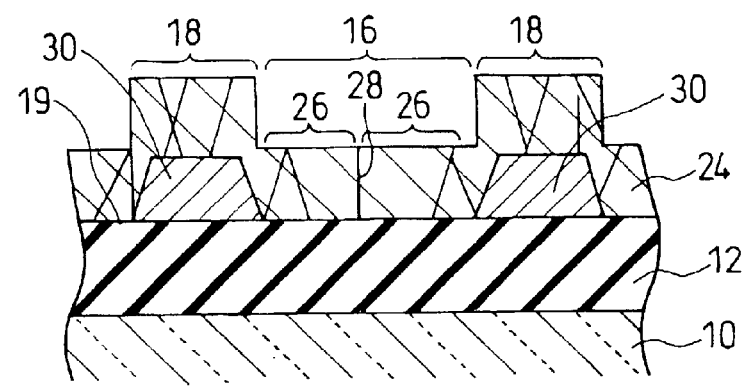
FIG. 3A is a cross-sectional view showing a first comparison example.
Figure 3B:
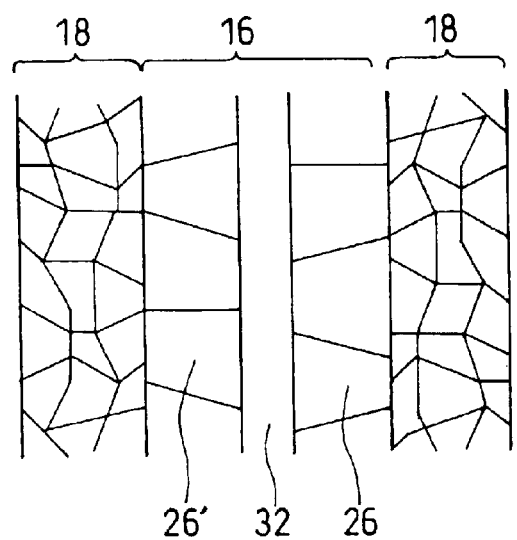
FIG. 3B is a plan view showing a second comparison example.

In a separate embodiment of the TFT of the present invention, a micro-crystallization configuration 32 can also be formed between the two rows 26 and 26' of the crystal grains of the thin-film part 16 serving as a channel part 37 along a border line 28 formed between the two rows of the crystal grains 26 and 26', as shown in FIG. 3(B).

A method for manufacturing a TFT according to the present invention is a method for manufacturing a TFT as mentioned above.

Note that, the present invention can adopt the following configuration.

(1) A TFT using a polycrystalline silicon film having a thin-film part and a thick-film part as an activated layer, wherein a channel part, an LDD region, and part of a source-drain region are formed in the thin-film part.

(2) A TFT as in (1) wherein the thin-film part is formed by two rows of crystal grains.

(3) A method for manufacturing a TFT using a polycrystalline silicon film having a thin-film part and a thick-film part as an activated layer, whereby annealing is done with an excimer laser having an energy density that completely melts the thin-film part but does not completely melt the thick-film part.

(4) A method as in (3) wherein the thin-film part region width is 8 μm or smaller.

In a method for manufacturing a polycrystalline silicon film whereby an amorphous silicon thin film is irradiated by an excimer laser, the amorphous silicon thin film has two types of film thicknesses, the irradiation intensity of the excimer laser light is an intensity that completely melts the thin-film part of the amorphous silicon thin film, and also that does not completely melt the thick-film part of the amorphous silicon thin film. This method provides a TFT having a channel region and an LDD region in the thin-film part.

Hereunder, more specific embodiments of the TFT of the present invention will be described in detail, with references made to relevant accompanying drawings.

Figure 1A:
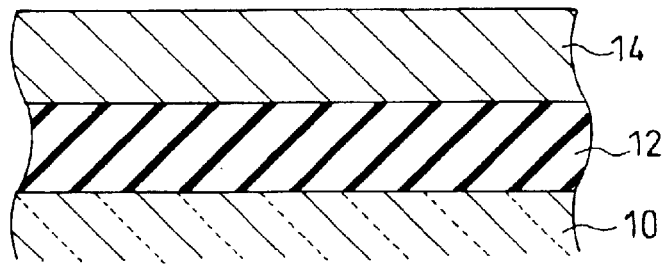
FIG. 1 is a cross-sectional view showing a first embodiment of a TFT according to the present invention, with FIG. 1(A) to FIG. 1 (D) showing the progression of the manufacturing process.

First, using the PECVD (plasma enhanced CVD) method, an $SiO_2$ film 12 that is an insulation film and forms an underlayer, is formed followed by an amorphous silicon film 14 onto a glass substrate 10 (FIG. 1(A)).

The film thickness of both films is 100 nm.

Figure 1B:
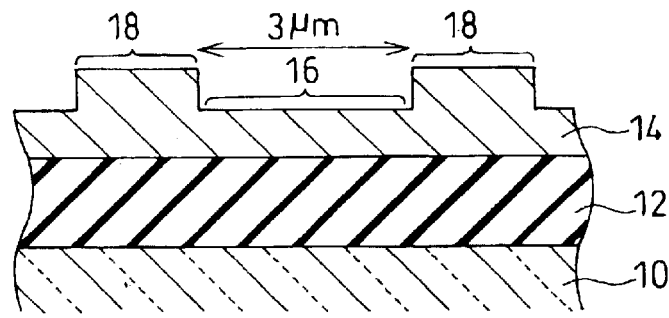

Next, the glass substrate 10 and the like are dehydrogenated at 500° C. for 5 minutes, and conventional photolithography and dry etching are used to form a thin-film part 16 and a thick-film part 18 on the amorphous silicon film 14 (FIG. 1(B)).

Figure 1C:
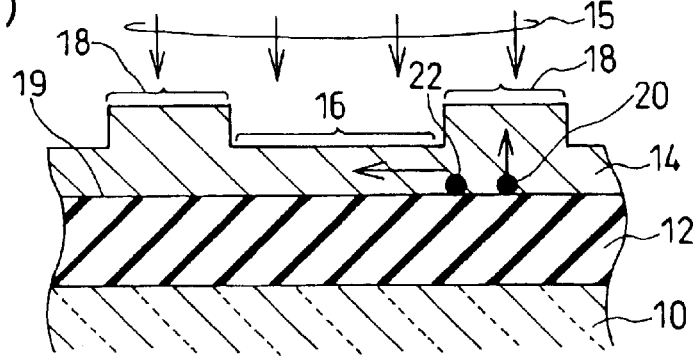

The thin-film part 16 has a film thickness of 40 nm and a region width of 3 μm. The film thickness of the thick-film part 18 remains 100 nm. Next, the surface of the amorphous silicon film 14 is irradiated with excimer laser light 15 (FIG. 1(C)).

The annealing apparatus used is a conventional mass-produced apparatus having 200 mm×0.4 mm optics. The annealing conditions thereof are set so that the energy density is 430 $mJ/cm^2$, which completely melts the thin-film part 16, and the scanning pitch is made 40 μm.

As mentioned above, the phrase "energy density that completely melts" in this case means an energy density that is at least as great as the micro-crystallization threshold value.

For example, as disclosed in Japanese unexamined patent publication (KOKAI) No. H11-274095, in laser annealing of the amorphous silicon film 14, the crystal grain diameters in the polycrystalline silicon film 24 that is formed are dependent upon the laser energy density.

As the energy density increases, the grain diameter increases. However, as mentioned above, it is known that after exceeding a specific energy density, the diameter becomes a very small value of 20 nm or smaller (although for some film thicknesses, rather than crystallizing after melting with laser light, the film becomes amorphous). The energy density at this point is known as the micro-crystallization threshold value.

The micro-crystallization threshold value of an amorphous silicon film having a film thickness of 40 nm was 410 $mJ/cm^2$.

Figure 1D:
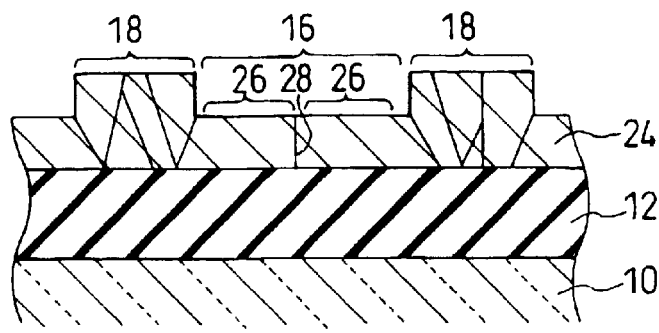

For this reason, in the case of an amorphous silicon film having the same thickness, if irradiation is done at 430 $mJ/cm^2$, micro-crystallized construction should occur. In this embodiment, however, after irradiation of the laser with 430 $mJ/cm^2$, in the thin-film part 16, large coarse crystal grains 26 having a grain diameter of 1.5 μm, which is approximately ½ the width of the thin-film part 16 were formed as shown in FIG. 1(D).

The generation of such large coarse crystal grains is attributed to the existence of the thick-film parts 18 on both sides of the thin-film part 16.

In the thick-film part 18, because the energy density of 430 $mJ/cm^2$ is below the micro-crystallization threshold value (approximately 570 $mJ/cm^2$), the substrate/silicon boundary 19 is the main nucleation site 20, and crystal growth occurs from the substrate/silicon boundary 19 toward a surface of the amorphous silicon film 14.

On the other hand, in the thick-film part 16, because melt is complete and nucleation at the substrate/silicon boundary 19 is suppressed, crystal grains formed in the thick-film part 18 are serving as seed crystals 22, so that large coarse crystal grains 26 growing in the lateral direction (film surface direction) are obtained. The large coarse crystal grains 26, therefore, can be said to be position-controlled in one dimension.

As shown in the plan view of FIG. 2(A), because large coarse crystal grains 26 grow from both ends of the thin-film part 16, the crystal grain boundary 28 is formed so as divided the thin-film part 16 in two portions.

At an energy density that is excessively high, so as to cause complete melt of the thick-film part 18, micro-crystallized constructions are formed in both the thin-film part 16 and the thick-film part 18.

In the case in which the energy density is insufficient and thus incomplete melt is occurred in the thick-film part 18, as shown in FIG. 3(A), there is a residual amorphous silicon film 30 in the region near the substrate/silicon boundary 19.

In this case, because the seed crystals are formed more on the thin-film part 16 side than at the boundary between the thin-film part 16 and the thick-film part 18, the grain diameter of each one of the large coarse crystal grains 26 is reduced.

Additionally, in the case in which the energy density is excessively low and does not completely melt the thin-film part 16, because nucleation occurs at the substrate/silicon boundary 19, non-uniform crystal grains smaller than 1 μm are formed randomly both in the thin-film part 16 and the in the thick-film part 18.

Therefore, the irradiation energy density is set so that it is at least the micro-crystallization threshold value of the thin-film part 16 and also does not reach the abrasion threshold value, and further so that it is at least a value at which the entire amorphous silicon film in the thick-film part 18 is made polycrystalline in the film thickness direction but does not reach the micro-crystallization threshold value.

In this embodiment of the present invention, because the above-noted values are 410 $mJ/cm^2$, 600 $mJ/cm^2$ or greater, 250 $mJ/cm^2$, and 570 $mJ/cm^2$, an irradiation energy density of 410 to 570 $mJ/cm^2$ results in a necessary irradiation control condition to obtain a polycrystalline silicon film 24 having uniform and position-controlled large coarse crystal grains 26.

Although the grain diameter of the large coarse crystal grains 26 are dependent upon the irradiation energy density and on the difference in film thicknesses between the thin-film part 16 and the thick-film part 18, because they are mainly dependent upon the substrate temperature and the like, with the substrate at room temperature, the approximate limit is 2 μm. For a thin-film part 16 with a region width of 5 μm, as shown in FIG. 3(B), although large coarse crystal grains 26 of 2 μm on each side of the thin-film part 16 are formed, there is micro-crystallized construction 32 is formed in the central region having 1 μm width thereof.

Additionally, at a substrate temperature of 400° C., there is an increase in the grain diameter of the large coarse crystal grains 26 to approximately 4 μm.

Using a polycrystalline silicon film 24 formed by the large coarse crystal grains 26, which are position-controlled in one dimension, a gate insulation film 34, a gate electrode 36, an LDD region 38 on both sides of the gate electrode 36, and a source-drain region 40 are formed, as shown in FIG. 2(B).

In this case, a width of the gate electrode (TFT channel length) is 1.5 μm and the LDD length is 0.5 μm. After this, although not shown in the drawings, an interlayer insulation film 34 and a source-drain electrode interconnect 71, 72, are formed, thereby completing the TFT 42.

That is, the TFT 42 is formed by a polycrystalline silicon film 24 having a thin-film part 16 and a thick-film part 18, wherein the thin-film part 16 is used minimally as the channel part 37. The polycrystalline silicon film is formed by laser annealing of an energy density whereby the thin-film part 16 is completely melted, but whereby the thick-film part 18 is not completely melted.

Because a TFT 42 fabricated as described above has a crystal grain boundary 28 that is substantially perpendicular to the channel length direction which significantly prevents carrier movement, and this being controlled as a single plane, the mobility is high, and there is little variation between elements.

Additionally, because the channel/LDD region boundary 44 and the LDD/source-drain boundary 46 are formed within one and the same large coarse crystal grains 26 in the channel length direction, the leakage current is also an extremely small value, on the order of an TFT on a single crystal silicon substrate.

From the standpoint of reducing the sheet resistance, controlling ability for the profile when introducing dopants, and etching control ability for forming contact holes, it is advantageous that the thick-film part 18 is included within the source-drain region 40. In the case of a self-aligned TFT without an LDD region 38, even though the leakage current is large, because the channel/source-drain terminals are formed in one and the same crystal grains in the channel length direction, the value of the leakage current is small compared with a conventional self-aligned polycrystalline silicon TFT.

In the case of forming a thickness difference in the amorphous silicon film, as seen in Japanese Patent No. 2689596, it possible to have two film growths of the amorphous silicon film, there is natural oxide film that remains at the boundary of the two amorphous silicon films.

The use of such a thick-film part with a residual natural oxidized film therewithin is used in the source-drain region of a TFT is not desirable, because of an increase in the source-drain resistance.

Figure 4A:
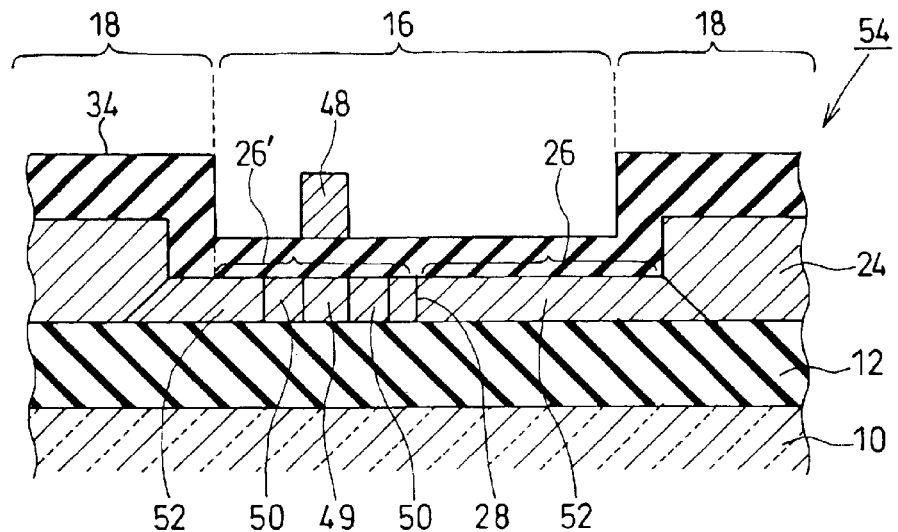
FIG. 4A is a cross-sectional view showing a second embodiment of a TFT according to the present invention.

FIG. 4(A) is a cross-sectional view showing a TFT according to a different embodiment of the present invention, which is described below. In this embodiment, elements that are the same as shown in FIG. 2(B) are assigned the same reference numerals and are not described herein.

In the same manner as described regarding the above-menntioned embodiment, laser annealing is done at 400° C., and a polycrystalline silicon film 24 is formed having large coarse crystal grains in two rows of 3 μm. Using the polycrystalline silicon film 24, a gate insulation film 34, a gate electrode 48, an LDD region 50 on both sides of the gate electrode 48, and a source-drain region 52 are formed.

By doing this, a TFT 54 is fabricated with a channel length of 0.8 μm and an LDD region having an LDD length of 0.5 μm is formed on both sides. The channel part 49, by being formed within one of the large coarse crystal grains 26, does not include the crystal grain boundary 28 that divides the thin-film part 16 in two portions.

Although it is desirable that the crystal grain boundary 28 be in the source-drain region 52, by the gate length, the LDD length, or photolithography precision in alingment, it is possible to have it included within either one of the LDD regions formed in the source side or the drain side.

From the standpoint of low leakage current, it is desirable that the crystal grain boundary 28 be in the LDD region 50 on the source side.

Figure 4B:
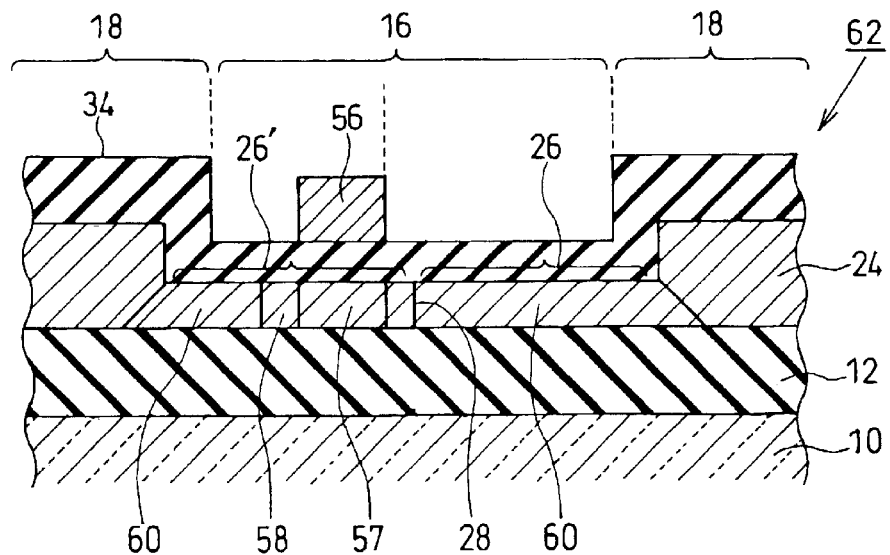
FIG. 4B is a cross-sectional view showing a third embodiment of a TFT according to the present invention.

FIG. 4(B) is a cross-sectional view showing a separate embodiment of the TFT according to a the present invention, which is described below.

Elements which are the same as in FIG. 2(B) are assigned the same reference numerals and are not described herein.

Similar to the first embodiment, a polycrystalline silicon film 24 is formed and which having large coarse crystal grains 26 arranged in two rows of 1.5 μm width. Using the polycrystalline silicon film 24, a gate insulation film 34, a gate electrode 56, a LDD region 58 on one side of the gate electrode 56, and a source-drain region 60 are formed.

By doing this, a TFT 62 having a channel length of 0.8 μm and a one-side LDD structure with an LDD length of 0.2 μm is fabricated. The channel part 57 in this case is formed within the large coarse crystal grains 26 on one side. The crystal grain boundary 28 that divides the thin-film part 16 in two parts does not exist in the channel part 57 and the LDD region 58.

As stated above, a basic technical conception of the method for manufacturing the thin-film transistor as explained above, is characterized in that the comprising the steps of;

forming a thin-film part and a thick-film part of an amorphous silicon film on a substrate;

polycrystallizing the thin-film part and the thick-film part by laser annealing the amorphous silicon film using an energy density completely melting the thin-film part and not completely melting the thick-film part; and forming a thin-film transistor with the thin-film part as at least a channel part.

And further, in the method for manufacturing a thin-film transistor as mentioned above, it is preferable that the process of forming a thin-film part and a thick-film part of an amorphous silicon film on a substrate, comprises the steps of;

forming an amorphous silicon film on the substrate; and partially etching a part of the amorphous silicon film to a depth a surface thereof being lower than a surface of the rest part of the amorphous silicon film.

On the other hand, in the method for manufacturing a thin-film transistor as mentioned above, it is also preferable that the process of forming a thin-film part and a thick-film part of an amorphous silicon film on a substrate comprises the steps of;

forming a first amorphous silicon film on the substrate;

etching a part of the first amorphous silicon film; and forming a second amorphous silicon film on the substrate that includes the first amorphous silicon film thus etched.

More over, in the method for manufacturing a thin-film transistor as mentioned above, it is further preferable that the energy density completely melting the thin-film part is an energy density at least as great as a micro-crystallization threshold value of the thin-film part, and wherein the energy density not completely melting the thick-film part is an energy density less than a micro-crystallization threshold value of the thick-film part.

In addition thereto, in the method for manufacturing a thin-film transistor as mentioned above, it is further preferable that the energy density completely melting the thin-film part is an energy density at least as great as a micro-crystallization threshold value and less than an abrasion threshold value of the thin-film part and wherein the energy density not completely melting the thick-film part is an energy density at least as great as the poly-crystallization threshold value and less than the micro-crystallization threshold value of the thick-film part.

It will be understood that the present invention is not restricted by the above-described embodiments, which are provided as examples. For example, it is alternatively possible in the present invention to form a first amorphous silicon film on a substrate, and then to etch a part of the first amorphous silicon film, so as to form a second amorphous silicon film on the substrate that includes the first amorphous silicon film, thereby forming a thin-film part and a thick-film part.

According to the present invention as described in detail above, by forming a polycrystalline silicon film by laser annealing with an energy density that completely melts the thin-film part but does not completely melt the thick-film part, a channel part is formed with large coarse crystal grains grown from the boundary between the thin-film part and the thick-film part, so that it is possible by using a conventional laser annealing apparatus to easily achieve such performance as high carrier mobility and low leakage current.

In addition to the channel part, by forming the LDD region and a part of the source-drain region are formed in the thin-film part, both of the LDD region and part of the source-drain region are formed to have the large coarse crystal grains, resulting in reduced leakage current in the LDD region and a low resistance in the source-drain region.

By forming the thin-film part by means of two rows of crystal grains in the channel length direction, the crystal grain boundary intersecting the channel length direction in the thin-film part is substantially one plane, resulting in an improvement in carrier mobility.

Because the channel part is formed by only one of the two rows of crystal grains, the crystal grain boundary intersecting the channel length direction is substantially non-existent, thereby improving the carrier mobility.

By making the channel length direction of the thin-film part be 8 μm or smaller, it is relatively easy to form large coarse crystal grains of up to 4 μm, thereby facilitating the formation of two rows of crystal grains in the channel width direction in the thin-film part.

What is claimed is:

1. A thin-film transistor which comprising a polycrystalline silicon film layer formed on a substrate, a gate electrode formed on said polycrystalline silicon film layer via a gate insulation layer and source and drain electrodes both being arranged on both sides of said gate electrode and being connected to said polycrystalline silicon film layer, and wherein a part of said polycrystalline silicon film layer comprising a thin-film part and a thick-film part and at least a part of said thin film part being minimally used as a channel part of said transistor, and further wherein said thin-film part comprising large coarse crystal grains.

2. A thin-film transistor according to claim 1, wherein said thick-film part comprising crystal grains a size of which is smaller than that of said large coarse crystal grains formed in said thin-film part.

3. A thin-film transistor according to claim 1, wherein said large coarse crystal grains formed in said thin-film part are grown along a direction parallel to a surface of said channel part thereof, while said crystal grains formed in said thick-film part are grown along a direction from a surface of said substrate to a surface of said polycrystalline silicon film layer.

4. A thin-film transistor according to claim 1, wherein said source electrode is formed on one of said thick-film parts, while said drain electrode being formed on another thick-film part.

5. A thin-film transistor according to claim 1, wherein, in addition to said channel part, an LDD region and a part of a source-drain region are formed in a part of said channel part of said thin-film part.

6. A thin-film transistor according to claim 1, wherein at least two rows of said crystal grains are formed in the channel length direction of said thin-film part.

7. A thin-film transistor according to claim 6, wherein a channel part is formed in only one of said two rows of crystal grains.

8. A thin-film transistor according to claim 7, wherein a micro-crystallization configuration is formed between said two rows of said crystal grains of said channel parts along a border line formed between said two rows of said crystal grains.

9. A thin-film transistor according to claim 1, wherein a channel length direction of said thin-film part is 8 μm or smaller.

10. A thin-film transistor which comprising a polycrystalline silicon film layer formed on a substrate, a gate electrode formed on said polycrystalline silicon film layer via a gate insulation layer and source and drain electrodes both being arranged on both sides of said gate electrode and being connected to said polycrystalline silicon film layer, and wherein a part of said polycrystalline silicon film layer comprising a thin-film part and a thick-film part and at least a part of said thin film part being minimally used as a channel part of said transistor, and further wherein at least a portion of said thin-film part is in fully melted condition, while at least a portion of said thick-film part is in not fully melted condition.

11. A thin-film transistor comprising:
   a polycrystalline silicon film comprising a thin-film part and a thick-film part, said thin-film part being minimally used as a channel part,
   wherein said polycrystalline silicon film is formed by laser annealing with an energy density that completely melts said thin-film part but does not completely melt said thick-film part.

12. A thin-film transistor according to claim 11, wherein said energy density completely melting said thin-film part is an energy density at least as great as a micro-crystallization threshold value of said thin-film part, and wherein said energy density not completely melting said thick-film part is an energy density less than a micro-crystallization threshold value of said thick-film part.

13. A thin-film transistor according to claim 11, wherein said energy density completely melting said thin-film part is an energy density at least as great as a micro-crystallization threshold value and less than an abrasion threshold value of said thin-film part and wherein said energy density not completely melting said thick-film part is an energy density at least as great as the poly-crystallization threshold value and less than the micro-crystallization threshold value of the thick-film part.

14. A thin-film transistor according to claim 11, wherein, in addition to said channel part, an LDD region and a part of a source-drain region are formed in a part of said channel part of said thin-film part.

15. A thin-film transistor according to claim 11, wherein at least two rows of said crystal grains are formed in the channel length direction of said thin-film part.

16. A thin-film transistor according to claim 15, wherein a channel part is formed in only one of said two rows of crystal grains.

17. A thin-film transistor according to claim 16, wherein a micro-crystallization configuration is formed between said two rows of said channel parts of said crystal grains along a border line formed between said two rows of said crystal grains.

18. A thin-film transistor according to claim 11, wherein a channel length direction of said thin-film part is 8 μm or smaller.

19. A method for manufacturing a thin-film transistor which comprising a polycrystalline silicon film layer formed on a substrate, a gate electrode formed on said polycrystalline silicon film layer via a gate insulation layer and source and drain electrodes both being arranged on both sides of said gate electrode and being connected to said polycrystalline silicon film layer, said method comprising the steps of;

forming a thin-film part and a thick-film part of an amorphous silicon film on a substrate;

polycrystallizing said thin-film part and said thick-film part by laser annealing said amorphous silicon film using an energy density completely melting said thin-film part and not completely melting said thick-film part; and forming a thin-film transistor with said thin-film part as at least a channel part.

20. A method for manufacturing a thin-film transistor according to claim 19, wherein said process of forming a thin-film part and a thick-film part of an amorphous silicon film on a substrate, comprises the steps of;

forming an amorphous silicon film on said substrate; and partially etching a part of said amorphous silicon film to a depth a surface thereof being lower than a surface of the rest part of said amorphous silicon film.

21. A method for manufacturing a thin-film transistor according to claim 19, wherein said process of forming a thin-film part and a thick-film part of an amorphous silicon film on a substrate comprises the steps of;

forming a first amorphous silicon film on said substrate;

etching a part of said first amorphous silicon film; and forming a second amorphous silicon film on said substrate that includes said first amorphous silicon film thus etched.

22. A method for manufacturing a thin-film transistor according to claim 19, wherein said energy density completely melting said thin-film part is an energy density at least as great as a micro-crystallization threshold value of said thin-film part, and wherein said energy density not completely melting said thick-film part is an energy density less than a micro-crystallization threshold value of said thick-film part.

23. A method for manufacturing a thin-film transistor according to claim 19, wherein said energy density completely melting said thin-film part is an energy density at least as great as a micro-crystallization threshold value and less than an abrasion threshold value of said thin-film part and wherein said energy density not completely melting said thick-film part is an energy density at least as great as the poly-crystallization threshold value and less than the micro-crystallization threshold value of the thick-film part.

* * * * *

UNITED STATES PATENT AND TRADEMARK OFFICE
CERTIFICATE OF CORRECTION

| | | |
|---|---|---|
| PATENT NO. | : 6,815,269 B2 | Page 1 of 1 |
| APPLICATION NO. | : 10/430540 | |
| DATED | : November 9, 2004 | |
| INVENTOR(S) | : Hiroshi Okumura | |

It is certified that error appears in the above-identified patent and that said Letters Patent is hereby corrected as shown below:

IN THE TITLE at Title Page, Item (54) and above paragraph 1, column 1, lines 1 and 2

Delete "THIN-FILM TRANSISTOR AND METHOD FOR MANUFACTURING THE SAME" and replace with "THIN-FILM TRANSISTOR AND METHOD FOR MANUFACTURING SAME". The title should not include the word "THE" before the last word of "SAME".

Signed and Sealed this
Twenty-eighth Day of June, 2011

David J. Kappos
*Director of the United States Patent and Trademark Office*